United States Patent [19]
Myer

[11] Patent Number: 6,127,889
[45] Date of Patent: Oct. 3, 2000

[54] NESTED FEED FORWARD DISTORTION REDUCTION SYSTEM

[75] Inventor: Robert Evan Myer, Denville, N.J.

[73] Assignee: Lucent Technologies Inc., Murray Hill, N.J.

[21] Appl. No.: 09/195,754

[22] Filed: Nov. 18, 1998

[51] Int. Cl.$^7$ ............................................. H03F 1/26
[52] U.S. Cl. ............................................. 330/149; 330/151
[58] Field of Search ............................... 330/52, 149, 151

[56] References Cited

U.S. PATENT DOCUMENTS

| | | | |
|---|---|---|---|
| 4,580,105 | 4/1986 | Myer | 330/149 |
| 4,583,049 | 4/1986 | Powell | 330/151 |
| 4,885,551 | 12/1989 | Myer | 330/52 |
| 4,926,136 | 5/1990 | Olver | 330/149 |
| 5,012,490 | 4/1991 | Myer | 375/58 |
| 5,304,945 | 4/1994 | Myer | 330/149 |
| 5,430,893 | 7/1995 | Myer | 455/209 |
| 5,619,168 | 4/1997 | Myer | 330/149 |
| 5,847,603 | 12/1998 | Myer | 330/52 |
| 5,977,826 | 11/1999 | Behan et al | 330/151 |

*Primary Examiner*—Steven J. Mottola
*Attorney, Agent, or Firm*—Julio A. Garceran

[57] ABSTRACT

A nested feed forward distortion reduction system, which reduces the distortion from a main amplifier on a main signal path, uses a nested feed forward arrangement for the correction amplifier to reduce the distortion produced from the correction amplifier. In reducing the distortion from the correction amplifier(s) and using progressively higher quality correction amplifier(s), the nested feed forward arrangement produces an improved, more stable representation of the distortion from the main amplifier, thereby alleviating the need for variable gain and/or phase control in producing amplified signal with reduced distortion.

9 Claims, 3 Drawing Sheets

NESTED FEED FORWARD DISTORTION REDUCTION SYSTEM

BACKGROUND OF THE INVENTION

1. Field of the Invention

This invention relates to amplifiers and, more particularly, to a nested feed forward distortion reduction system for amplifiers.

2. Description of Related Art

Amplifiers often add undesired distortion to a signal, creating an output signal comprising distortion or nonlinear components and the input signal component. The distortion includes any undesired signals added to or affecting adversely the signal. There is therefore a need to devise techniques that can eliminate substantially or reduce significantly the distortion produced by the amplifier.

Feed-forward correction is routinely deployed in modem amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of the input signal pattern as well as the resultant distortion location, some feed forward schemes inject a known signal, i.e. a pilot signal, in the main signal path to go with the distortion produced by the amplification process. By designing the feed forward distortion reduction circuitry to detect and reduce the pilot signal, the distortion is also reduced.

FIG. 1 discloses a feed forward correction circuitry 10 which can use a pilot signal to reduce distortion produced by RF amplifier 12. A signal, such as a carrier signal, is applied to a splitter 14. The splitter 14 replicates or produces an analog representation of the signal on a main signal path 16 and a feed forward path 18. The splitter 14 is part of a feed forward loop referred to as loop # 1, which in addition to the splitter 14, comprises a gain & phase circuit 20, coupler 22, the RF amplifier 12, delay circuit 24 and couplers 26 and 28. The signal on the main path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the signal so as not to interfere with the operation of the amplifier 12. The output of the coupler 22 is applied to the amplifier 12 whose output comprises the amplified signal, the amplified pilot signal and distortion signals produced by the amplifier 12. A portion of the output of the amplifier 12 is obtained from the coupler 26 and is combined with a delayed version of the signal (signal on path 18) at the coupler 28 via coupling path 30. The signal on the path 18 has experienced sufficient delay provided by delay circuit 24 so that such signal experiences the same delay as the signal appearing at the coupler 28 via the path 30.

The gain & phase circuit 20 is controlled via control path 32 with control signals to adjust the gain and phase of the signal such that the signal appearing at the coupler 28 via the path 30 is substantially the inverse (equal in amplitude but 180° out of phase) of the delayed signal at the coupler 28. The control signal appearing on the control path 32 of the gain & phase circuit 20 is derived from the signal at point A in a well known manner such as the use of detection circuits. The detection circuits detect well known electrical signal characteristics such as amplitude, phase, and frequency of the signal. Therefore, the signals applied to the coupler 28 substantially cancel each other leaving at point A the pilot signal and the distortion produced by the amplifier 12. Loop # 1 is thus a feed forward loop which serves to isolate at point A the pilot signal and distortion signals produced by the amplifier 12.

The signals appearing at point A (pilot signal and distortion signals) are fed to gain & phase circuit 34 whose output is fed to main correction amplifier 36 whose output is applied to coupler 38. A portion of the output signals (signal, pilot signal and distortion signals) of the amplifier 12 is fed to delay circuit 40 whose output is fed to the coupler 38. The delay circuit 40 is designed such that signals from the output of the amplifier 12 applied to the coupler 38 experience substantially the same delay as the signals from the output of the amplifier 36 applied to the coupler 38.

The pilot signal is used to obtain information about how well the distortion is being cancelled from the main signal path 16. The information is obtained by detecting well known electrical signal characteristics of the pilot signal, such as the amplitude, spectral content, phase response of the pilot signal. For example, the amplitude of the pilot signal after cancellation at the coupler 38 can indicate how well the distortion is being cancelled. If the amplitude of the pilot signal is small after the coupler 38, the amplitude of the distortion is also small. Detection circuit 42, such as a mixer connected to a log detector (or other known detection circuits), will detect the pilot signal and use this information to generate control signals onto path 46 to cause the gain & phase circuit 34 to modify the pilot signal at point A such that the pilot signal on the main path 16 at the coupler 38 is substantially the inverse (equal in amplitude but 180° out of phase) of the pilot signal on the feed forward path 18 at the coupler 38. The corresponding pilot signals and the distortion signals at the coupler 38 substantially cancel each other respectively at the coupler 38 leaving the signal (or an amplified version of the signal) at the output of the system. Therefore, loop # 2, which comprises the coupler 26, the coupler 28, the gain & phase circuit 34, the amplifier 36, the coupler 38 and the delay circuit 40 is a feed forward loop which uses the information obtained from the pilot signal to cancel substantially the distortion produced by the amplifier 12.

In actual systems, however, there is rarely an absolute cancellation of the distortion and the pilot signals. Feed forward distortion reduction systems require tight operating tolerances, for example, to achieve a 30 dB reduction in IMDs, typical feed forward correction systems may require a + or −0.1 dB frequency flat response (amplitude deviation over the frequency band of operation) and a + or −1 degree phase linearity (phase deviation from a straight line in the frequency band of operation). To obtain this accuracy is difficult. In feed forward distortion reduction signals which use a pilot signal, the amplitude of the pilot signal is typically relatively small at the output of the feed forward distortion reduction system because of the cancellation of the pilot and the relative amplitude of the pilot signal with respect to the amplitude of the output signal. Thus, it becomes difficult to detect the pilot signal at the output of the system. To improve detection of the pilot signal at the output of the distortion reduction system, schemes are developed to generate the pilot signal at an appropriate location and to improve detection and control. Such schemes typically add costs to the systems.

Pilotless feed forward distortion reduction schemes have been developed to eliminate the pilot signal, thereby eliminating the need for the pilot generation, detection and control circuitry, such as the coupler 22 and pilot detection circuit 42. The pilotless feed forward reduction systems, however, do not have a known pilot signal which can be detected at the output of the feed forward distortion reduction system to compensate for changing operating conditions. Instead of detecting the pilot signal to improve cancellation at the coupler 38, the pilotless feed forward systems can use gain and phase control circuitry 54 responsive to the inputs from the couplers 56 and 58 to produce gain and phase control signals to the gain and phase circuits 34. In response, the gain and phase circuits 34 provide variable phase and/or gain adjustments which maintain the appropriate gain and/or phase for the distortion on the feed forward path 18 to improve reduction of the distortion of the main signal path 16 at the coupler 38. The gain and phase control circuitry adds costs and complexity, and to achieve adequate reduction of the distortion is difficult. For example, the correction amplifier 36 produces the amplified distortion with second distortion which is injected into the main signal path 16.

A need exists for a distortion reduction system that can provide adequate distortion reduction while reducing any problems associated with other distortion reduction systems.

SUMMARY OF THE INVENTION

The present invention involves a nested feed forward distortion reduction system which in reducing the distortion from a main amplifier on a main signal path uses a nested feed forward arrangement for the correction amplifier to reduce the distortion produced from the correction amplifier. In reducing the distortion from the correction amplifier(s) and using progressively higher quality correction amplifier (s), the nested feed forward arrangement produces an improved, more stable representation of the distortion from the main amplifier, thereby alleviating the need for variable gain and/or phase control in producing amplified signal with reduced distortion.

For example, a feed forward distortion reduction system receives a signal to be amplified on a main signal path and produces an analog representation of the signal onto the main signal path and a feed forward path. The signal on the main signal path is applied to the main amplifier whose output comprises the amplified signal and distortion signals produced by the main amplifier. A portion of the output of the main amplifier is placed on a coupling path and combined with a delayed version of the signal on the feed forward path to isolate the distortion produced from the main amplifier onto the feed forward path. The distortion on the feed forward path is fed to a nested feed forward arrangement. The nested feed forward arrangement provides the distortion to a main correction amplifier which amplifies the distortion from the main amplifier and generates second distortion. The nested feed forward arrangement reduces the second distortion from the correction amplifier using a smaller, higher quality second correction amplifier to produce an improved and more stable representation of the distortion from the main amplifier. By using an improved, more stable representation of the distortion from the main amplifier to reduce the distortion on the main signal path, the nested feed forward distortion reduction system provides improved distortion reduction and alleviates the need for phase and/or gain control. Using successive nested feed forward arrangements provides increasingly stable and more accurate representations of the distortion from the main amplifier.

In a exemplary nested feed forward arrangement, the distortion on the feed forward path is split onto a main correction path and a nested feed forward path. The distortion signal on the main correction path is fed to the main correction amplifier which produces an amplified distortion signal with second distortion produced from the main correction amplifier. A portion of the output of the main correction amplifier is placed on a coupling path and combined with a delayed version of the distortion on the second feed forward path to isolate the second distortion produced from the main correction amplifier onto the second feed forward path. The second distortion on the second feed forward path is fed forward through a second correction amplifier to reduce the second distortion from the main correction amplifier on the main correction path. The amplified distortion signal with reduced second distortion is used to provide improved reduction of the distortion from the main amplifier on the main signal path. The quality of the second correction amplifier controls the amount of distortion reduction in the feed forward distortion reduction system with the nested feed forward distortion reduction system.

Using this nested feed forward arrangement with a second correction amplifier of higher quality than the main correction amplifier reduces the need to use relative variable gain and/or phase control between the distortions on the second correction path and the nested feed forward path and/or between the signals on the main signal path and the feed forward path. Fixed gain and/or phase control can be used because the operation of the fixed feed forward distortion reduction system is controlled by the operation of the nested, higher quality correction amplifier. Since the correction amplifier handles smaller power levels, it can be of higher quality in that the correction amplifier produces a more linear representation of the input signal and is more temperature stable. As such, the nested feed forward arrangement produces a stable, less distorted representation of the distortion from the main amplifier, and the less distorted representation of the distortion can be used to reduce the distortion on the main signal path. Successive nested feed forward arrangements can be used to further improve the performance of the nested feed forward distortion reduction system and/or further reduce the need to use variable gain and/or phase control. A second nested feed forward arrangement for the second correction amplifier can be nested within the first nested feed forward arrangement. The second nested feed forward arrangement uses a third correction amplifier, which is yet smaller and of higher quality than the second correction amplifier, to reduce the second distortion from the second correction amplifier. As such, the third correction amplifier controls the distortion reduction performance of the distortion reduction system. Because the third correction amplifier is smaller, the overall efficiency of the system is not affected. Because the third correction amplifier is of higher quality and more stable, the forward distortion reduction system can be fixed and not require the variable gain and/or phase control.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
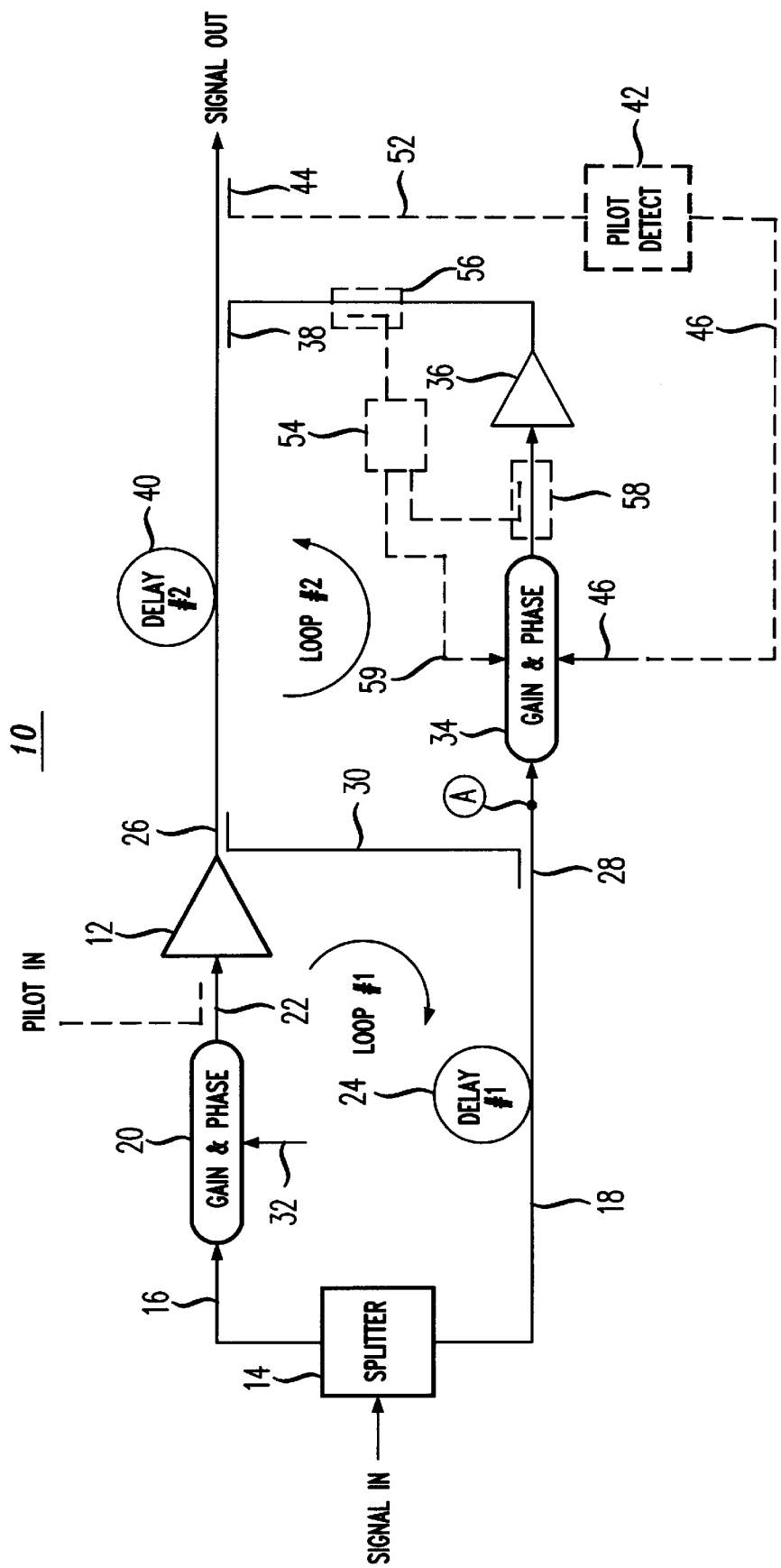
FIG. 1 is a block diagram of a prior art feed forward distortion reduction scheme used for RF amplifiers.
Figure 2:
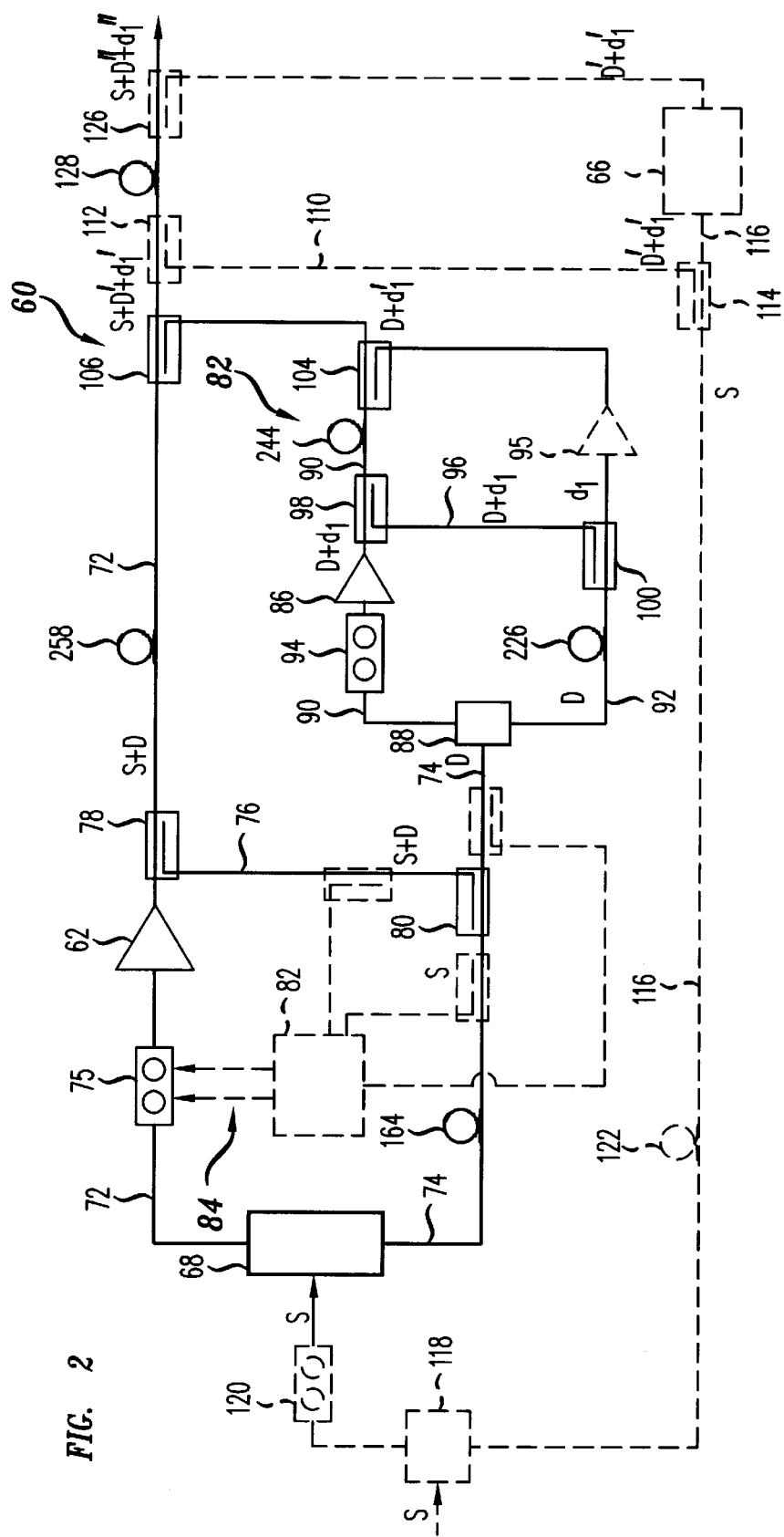
FIG. 2 shows a general block diagram of a feed forward distortion reduction system using a nested feed forward arrangement(s) according to the principles of the present invention.

An illustrative embodiment of a nested feed forward distortion reduction system according to the principles of the present invention is described below. FIG. 2 shows a general block diagram of a nested feed forward distortion reduction system 60 which is fixed and does not use variable phase and/or gain control to reduce the distortion from the output of an RF amplifier 62. The feed forward distortion reduction system 60 is shown as a first stage in a multiple stage pilotless feed forward reduction system which includes a second feed forward reduction stage 66 in dashed lines as would be understood by one of ordinary skill in the art with the benefit of this disclosure. Although the nested feed forward distortion reduction system is described as fixed, varying the gain and phase of signals to improve cancellation can be performed in the second stage 66, between the system 60 and stage 66, or in system 60 in certain embodiments.

The feed forward distortion reduction system 60 receives from a splitter 68 a signal S to be amplified and produces an analog representation of the signal S on a main signal path 72 and a feed forward path 74. The signal S on the main signal path 72 is applied to a gain & phase circuit 75. The output of gain & phase circuit 75 is applied to the amplifier 62 whose output comprises the amplified signal S with distortion D produced by the amplifier 62. A portion of the output S and D of the amplifier 62 is placed on a coupling path 76 by a coupler 78 and combined at the coupler 80 with a delayed version of the signal S on the path 74 to isolate the distortion D produced from the amplifier 62.

In this embodiment, the gain & phase circuit 75 adjusts the amplitude and phase of the signal on the main path 72 by a fixed amount. Other embodiments can control the phase and gain circuit with a phase and gain controller 82. The control signal(s) appearing on the control path(s) 84 of the gain & phase circuit 75 is derived from the portion of the amplified signal S and D on the coupling path 76 and the delayed version of the signal S on the path 74 and/or from the output of the coupler 80. The phase and gain circuit 75 adjusts the amplitude and phase of the signal S on the main signal path 72 prior to the amplifier 62 such that the amplified signal S and D at the coupler 80 is substantially the inverse (equal in amplitude but 180° out of phase) of the delayed signal S on the path 74. As such, the combining signals cancel to isolate the distortion D. As the cancellation of the combining signals S improves, the feed forward distortion reduction improves the isolation of the distortion D on the second path 74 at the output of the coupler 80. The feed forward distortion system 60 feeds forward the isolated distortion D on the path 74 through a nested feed forward arrangement 82 to reduce the distortion D on the main signal path 72 by combining the distortion D on the path 72 with a representation of the distortion D from the nested feed forward arrangement 82 which adds minimal distortion to the representation of the distortion D.

In this embodiment, the output of the coupler 80 is applied to the nested feed forward arrangement 82 for a main correction amplifier 86. The distortion D on the feed forward path 74 is split by a splitter 88 onto a correction path 90 and a second feed forward path 92. On the correction path 90, the distortion D is applied to a gain & phase adjuster 94 which adjusts the amplitude and phase of the signal D. The phase and gain adjuster 94 can be fixed in this embodiment because the nested feed forward arrangement 82 uses a second correction arrangement 95 which results in a stable and linear representation of the signal D on the correction path 90. Other embodiments could provide control signals to adjust the gain and phase of the phase and gain circuit 94 as described above for the phase and gain circuit 75.

The output of gain and phase adjuster 94 is applied to the main correction amplifier 86 whose output comprises the amplified signal D and distortion signals $d_1$ produced by the main correction amplifier 86. A portion of the output D and d1 of the correction amplifier 86 is placed on a nested coupling path 96 by a coupler 98 and combined at the coupler 100 with a delayed version of the signal D on the second feed forward path 92 to isolate the distortion d1 produced from the main correction amplifier 86.

The feed forward arrangement 82 feeds forward the isolated distortion d1 on the second feed forward path 92 through the second correction amplifier arrangement 95 to a coupler 104. The second correction amplifier arrangement 95 can simply be a second correction amplifier. Alternatively, the arrangement 95 can be a second nested feed forward arrangement including a second correction amplifier and third correction amplifier to reduce any distortion produced from the second correction amplifier. Using the nested feed forward arrangement enables the use of smaller, more stable and/or more linear amplifiers as nested correction amplifiers which control the performance of the feed forward distortion reduction system 60. As such, fixed relative phase and/or gain adjustments can be made between combining signals because the operation of the system 60 by the more stable higher quality, nested correction amplifier. If the main amplifier and/or main correction amplifier produces more distortion due to changing operating conditions, such as changing temperature, signal strength or signal frequency, the nested feed forward arrangement will enable the successive reduction of the distortion by continuing to produce an accurate representation of the distortion.

At the coupler 104, the second distortion d1 on the second feed forward path combines with a delayed version of the distortion D with d1 on the correction path 90 to reduce the distortion d1 on the correction path 90. The arrangement 82 is designed such that corresponding portions of the signals d1 applied to the coupler 104 destructively combine to produce at the output of the coupler 104 the amplified distortion D with reduced distortion d1'. The distortion D with reduced distortion d1' is fed forward to a coupler 106 where the distortion D with d1' combines with a delayed version of the signal S with distortion D to reduce the distortion from the main amplifier 62 on the main signal path 72. Because the distortion d1' from the correction amplifier 86 has been reduced, the reduction of the distortion D from the main signal path 72 is improved.

In certain embodiments, the nested feed forward distortion reduction system 60 can be used in a distortion reduction system having multiple feed forward reduction stages to cumulatively reduce the distortion from the output of the previous stage(s). For example, the nested feed forward distortion reduction system 60 can act as a first stage which produces the signal S with reduced distortion D' and d1'. The second feed forward reduction stage 66 receives as the input signal the reduced distortion D' and d1' from the nested feed forward reduction stage 64 via a coupling path 110. A coupler 112 couples a portion of the signal S with reduced distortion D' and d1' from the main signal path 72 onto the coupling path 110. A coupler 114 receives the signal S with distortion D' and $d_1$' from the coupling path 110 and combines the signal S and the distortion D' and $d_1$' from the coupling path 110 with a delayed signal S on a path 116 which was obtained from splitter 118. In this embodiment, the splitter 118 receives the signal S and provides versions of the signal S to a phase and gain adjuster 120 prior to the splitter 68 of the nested feed forward system 60 and the path 116. The signal S on the path 116 is delayed by a delay 122. The signal S on the path 116 experiences sufficient delay provided by the delay circuit 122 such that signal S experiences the same delay as the signal S appearing at the coupler 114 via the path 110. The coupler 114 destructively combines the signal S from the second coupling path 102 and the signal S from the path 116 and isolates the remaining distortion D' and $d_1$' from the nested feed forward system 60 on the path 116 leading to the second feed forward stage 66.

In this embodiment, the gain & phase adjuster 120 is fixed but embodiments could use a phase and gain controller to adjust the gain and phase provided by the gain and phase circuit 120 to the signal S prior to the amplifier 62 such that the amplified signal S, D' and d1' at the coupler 114 is substantially the inverse (equal in amplitude but 180° out of phase) of the delayed signal S on the path 116. In some embodiments, the gain and phase control circuit provides control signal(s) to the gain & phase circuit 120 derived from the portion of the amplified signal S, D' and d1' on the coupling path 110 and the delayed version of the signal S on the path 116. Because the desired amplitude and phase relationship (for example, the combining signals have the same amplitude and are 180 degrees out of phase) is maintained between the combining signals, the combining signals S sufficiently cancel to isolate the distortion D' and d1' at the coupler 114. In other embodiments, the gain and phase control circuit can be a logarithmic detector and a nulling circuit. In such an embodiment, a coupler produces a sample of the signal after the output of the coupler 114 to the log detector which produces a signal indicative of the amplitude of the signal. A nulling circuit attempts to reduce the signal from the log detector to improve cancellation of the signal and isolate the distortion D' and d1' after the coupler 114 by providing control signals to the phase and gain adjuster 120.

In this embodiment, the second feed forward arrangement 66 as well as any additional feed forward stages (not shown) can be configured to operate as described above for the nested first feed forward system 60 or could simply be an amplifier. As such, the second feed forward stage 66 produces a version of the reduced distortion D' and d1'. The distortion D' and d1' (as well as any minor distortion signals introduced by the amplifiers (not shown) in the second feed forward stage 66) is fed forward to further reduce the distortion D' and d1' from the amplified signal S at a coupler 126. The coupler 126 combines the distortion signals D' and $d_1$' from the second feed forward stage 66 with a delayed version of the signals S with distortion D' and $d_1$' on the main signal path 72 to further reduce the distortion D' and d1' produced from the nested feed forward system 60. The signals S with distortion D' and $d_1$' are fed to a delay circuit 128 which is designed such that signals from the outputs of the coupler 112 applied to the coupler 126 experience substantially the same delay.

Figure 3:
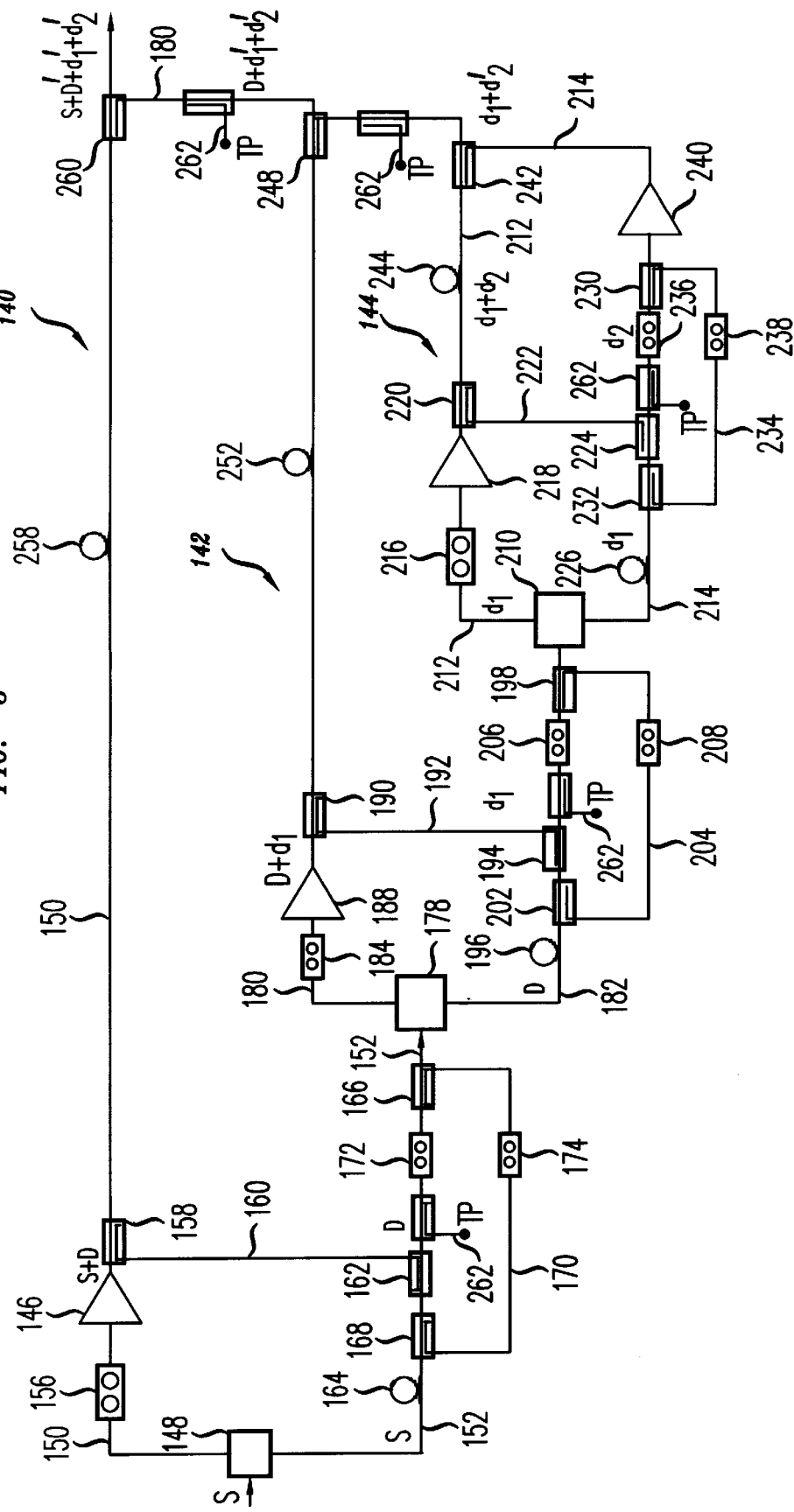
FIG. 3 shows a particular embodiment of a feed forward distortion reduction system using nested feed forward arrangements according to the principles of the present invention.

FIG. 3 shows a detailed implementation of a nested feed forward distortion reduction system 140 using successive nested feed forward arrangements 142 and 144. A signal S to be amplified by main amplifier 146 is received by the nested feed forward system 140, and a splitter 148 replicates or produces analog representations of the signal S onto a main signal path 150 leading to the main amplifier 146 and onto a feed forward path 152 leading to nested feed forward arrangements 142 and 144. On the main path 150 in this embodiment, the signal is applied to a gain & phase adjuster 156 which adjusts the phase and gain of the signal S on the main path 72. In this embodiment, the nested feed forward system does not require the phase and gain circuit to be controlled to provide a varying gain and phase. Instead, the gain and phase circuit 156 provides a fixed gain and phase adjustment to the signal S on the main path 150.

The output of gain and phase adjuster 156 is applied to the amplifier 146 whose output comprises the amplified signal S and distortion signals D, such as third order IMDs produced by the amplifier 146. A portion of the output of the amplifier 146 is obtained from a coupler 158 and placed on a coupling path 160. The signal S with D on the coupling path 160 is combined with a delayed version of the signal S on the feed forward path 152 at the coupler 162. The signal S on the path 152 has experienced sufficient delay provided by a delay circuit 164 so that such signal S experiences the same delay as the signal S appearing at the coupler 162 via the path 160. The gain & phase circuit 156 provides fixed gain and phase adjustments which adjust the amplitude and/or phase of the signal S on the main path 150 such that the signal S appearing at the coupler 162 via the path 160 is substantially the inverse (equal in amplitude but 180° out of phase) of the delayed signal S at the coupler 162. In general, a phase difference of 179 to 181 degrees and an amplitude difference of +or −0.1 dB between the combining signals can achieve a cancellation of 30 dB, and a 175–185 degree phase difference and a 2 dB amplitude difference can provide almost 20 dB of cancellation.

In this embodiment, a remaining signal S can appear at the output of the coupler 162 (along with the distortion D), and an improved combination of the remaining signal S (leakage signal S) and the signal S from the path 170 is made at a coupler 166. For example, after the coupler 162, some leakage signal S can remain on the path 152 after the coupler 162. As such, a coupler 168 couples a portion of the signal S from the path 152 prior to the coupler 162 onto the coupling path 170. A phase and gain circuit 172 adjusts the phase and amplitude of the remaining signal S with distortion D from the output of the coupler 162, and a phase and gain circuit 174 adjusts the phase and amplitude of the signal S on the coupling path 170. The phase and gain circuits 172 and 174 respectively adjust the phase and amplitude of the signal S from the coupler 162 and the signal S on the coupling path 170 to improve the reduction of the remaining signal S from the output of the coupler 162. The remaining signal S output from the phase and gain circuit 172 destructively combines with the signal S on the coupling path 170. The combination at the coupler 166 is made such that any remaining signal S is from the signal S from the path 152 rather than the signal S from the coupling path 160. As such, the coupler 166 provides the distortion D as the prominent signal on the path 152, and any remaining signal S can be fed forward along with the distortion signal D to constructively combine with the amplified signal S on the main signal path 150.

The output of the coupler 166 is applied to the nested feed forward arrangement 142. The nested feed forward arrangement 142 includes a splitter 178 which receives the distortion D and produces analog representations of the distortion D on a correction path 180 and a nested feed forward path 182. The phase and amplitude of the distortion D on the correction path 180 is adjusted by a phase and gain circuit 184. In this embodiment, the phase and gain circuit 184 provides fixed gain and phase adjustments to the distortion D on the correction path 180. The output of gain and phase adjuster 184 is applied to a correction amplifier 188 whose output comprises the amplified signal D and distortion signals d1 produced by the correction amplifier 188.

A portion of the output of the correction amplifier 188 is obtained from a coupler 190 and placed on a nested coupling path 192. The signal D with d1 on the coupling path 192 is combined at the coupler 194 with a delayed version of the signal D on the nested feed forward path 182. The signal D on the path 182 has experienced sufficient delay provided by a delay circuit 196 so that such signal D experiences the same delay as the signal D appearing at the coupler 194 via the path 192. The gain & phase circuit 184 provides fixed gain and phase adjustments which adjust the amplitude and/or phase of the signal D on the correction path 180 such that the signal D appearing at the coupler 194 via the path 192 is substantially the inverse (equal in amplitude but 180° out of phase) of the delayed signal D on the path 182 at the coupler 194. As such, the distortion d1 from the correction amplifier 188 is isolated at the output of the coupler 194. In general, a phase difference of 179 to 181 degrees and an amplitude difference of +or −0.1 dB between the combining signals can achieve a cancellation of 30 dB, and a 175–185 degree phase difference and a 2 dB amplitude difference can provide almost 20 dB of cancellation.

In this embodiment, a remaining signal D can appear at the output of the coupler 194 (along with the distortion d1), and an improved combination of the remaining signal D (leakage signal D) and the signal D from the nested feed forward path 182 is made at a coupler 198 using phase and gain circuits 206 and 208, coupler 202 and the path 204. As described above for the combination at the coupler 166, the combination at the coupler 198 is made such that any remaining signal D is from the signal D from the path 182 rather than the distortion D from the coupling path 192. As such, the coupler 198 provides the distortion d1 as the prominent signal on the path 182, and any remaining signal D can be fed forward along with the distortion signal D to constructively combine with the amplified signal D on the main correction path 180.

The output of the coupler 198 is applied to a second nested feed forward arrangement 144. The second nested feed forward arrangement 144 includes a splitter 210 which receives the distortion d1 and produces analog representations of the distortion d1 on a second correction path 212 and a second nested feed forward path 214. The phase and amplitude of the distortion d1 on the second correction path 212 is adjusted by a phase and gain circuit 216. In this embodiment, the phase and gain circuit 216 provides fixed gain and phase adjustments to the distortion d1 on the second correction path 212. The output of gain and phase adjuster 216 is applied to a second correction amplifier 218 whose output comprises the amplified signal d1 and distortion signals d2 produced by the second correction amplifier 218.

A portion of the output of the second correction amplifier 218 is obtained from a coupler 220 and placed on a second nested coupling path 222. The distortion d1 and d2 on the second nested coupling path 222 is combined at the coupler 224 with a delayed version of the signal d1 on the second nested feed forward path 214, thereby leaving the distortion d2 from the second correction amplifier 218 at the output of the coupler 224. The signal d1 on the path 214 has experienced sufficient delay provided by a delay circuit 226 so that such signal d1 experiences the same delay as the signal d1 with d2 appearing at the coupler 224 via the path 222. The gain & phase circuit 216 provides fixed gain and phase adjustments which adjust the amplitude and/or phase of the signal d1 on the second correction path 212 such that the signal d1 appearing at the coupler 224 via the path 222 is substantially the inverse (equal in amplitude but 180° out of phase) of the delayed signal d1 at the coupler 224.

In this embodiment, a remaining signal d1 can appear at the output of the coupler 224 (along with the distortion d2), and an improved combination of the remaining signal d1 (leakage signal d1) and the signal d1 from the path 214 is made at a coupler 230 using phase and gain circuits 236 and 238, coupler 232 and path 234. As described above for the combination at the coupler 166, the combination at the coupler 230 is made such that any remaining signal d1 is from the signal d1 from the path 214 rather than the signal d1 from the coupling path 222. As such, the coupler 230 provides the distortion d2 as the prominent signal on the path 214, and any remaining signal d1 can be fed forward along with the distortion d2 to constructively combine with the d1 with d2 from the second correction amplifier 218 on the second correction path 212.

The output of the coupler 230 is applied to a correction amplifier arrangement 240 which is shown as a third correction amplifier 240 but in some embodiment could be a third nested feed forward arrangement. The third correction amplifier 240 amplifies the distortion d2 and provides the distortion d2 to a coupler 242. The coupler 242 combines the amplified distortion d2 from the third correction amplifier 240 with a delayed version of the distortion d1 with d2 from the second correction amplifier 218 on the second correction path 212 to reduce the distortion d2 produced from the second correction amplifier 218 on the second correction path 212. The distortion d1 with d2 from the coupler 220 is fed to a delay circuit 244 which is designed such that signal d1 with d2 from the output of the coupler 220 experiences about the same delay as the signal d2 in getting to the coupler 242. A delay difference on the order of picoseconds can provide appropriate combination of the signals. The coupler 242 destructively combines the distortion d1 with d2 from the coupler 220 and the distortion d2 to produce the signal d1 with reduced distortion d2'. The signal d1 with reduced distortion d2' is output from the coupler 242 to a coupler 248. The coupler 248 combines the distortion d1 with d2' from the coupler 242 with a delayed version of the distortion D with d1 from the coupler 190 to reduce the distortion d1 produced from the correction amplifier 188 on the correction path 180. The distortion D with d1 from the coupler 190 is fed to a delay circuit 252 which is designed such that signal D with d1 from the output of the coupler 190 experiences about the same delay as the signal d1 with d2' in getting to the coupler 248. The coupler 248 destructively combines the distortion d1 with d2' from the coupler 242 and the distortion D with d1 to produce the signal D with reduced distortion d1' and d2'.

At the output of the coupler 158 on the main signal path 150, a portion of the signal (amplified signal S with distortion D) from the main amplifier 146 is fed to delay circuit 258 whose output is fed to a coupler 260. The delay circuit 258 is designed such that signals S with D from the output of the amplifier 146 applied to the coupler 260 experience substantially the same delay as the signal D with d1' and d2' applied to the coupler 260. The coupler 260 destructively combines the distortion D with d1' and d2' from the coupler 248 and the signal S with D from the main amplifier 146 to produce the signal S with reduced distortion D', d1' and d2'.

Thus, the nested feed forward system provides improved distortion reduction in producing the desired signal S because the distortion d1 and d2 from the correction amplifiers 188 and 218 is reduced before the distortion D from the main amplifier is reduced. As such, the distortion D, d1' and d2' from the output of the coupler 248 represents the distortion D from the main amplifier 146 with minimal distortion added. The distortions d1 and d2 become progressively less significant because the for each nested feed forward arrangement, the correction amplifier can be smaller and of higher quality, thereby producing less distortion. For example, the main amplifier 146 can be a 100 Watt, class AB amplifier which does not always run in its linear region of operation which results in distortion. The correction amplifier 188 can be a class AB amplifier rated at 10 Watts, and the second correction amplifier 218 is a class AB amplifier rated at 1 Watt. The third correction amplifier 240 can be a class A, temperature stable amplifier rated at 0.1 Watt which always operates in its linear region and thereby produces almost no distortion. Due to this successive nested feed forward arrangement, the operating characteristics of the third correction amplifier 240 controls the operation of the nested feed forward distortion reduction system. Since the third correction amplifier 240 produces relatively no distortion, the distortion from the small amount of distortion d2 from the second correction amplifier 218 can also be reduced, thereby improving the reduction of the distortion d1 from the correction amplifier 188 and leaving an improved representation of the distortion D at the output of the nested feed forward arrangement 142. Combining the distortion D on the main signal path 150 with an improved represention of the distortion D at the coupler 260 results in improved distortion reduction.

Furthermore, because the stable, higher quality third correction amplifier 240 controls the operating characteristics of the entire nested feed forward distortion reduction system, the system can be fixed. As such, a pilot signal is not necessary, and neither is the corresponding pilot detection circuitry and pilot control. Additionally, controlling the phase and gain adjustments of the phase and gain circuits is not required to improve isolation of distortion signals on feed forward paths or to reduce distortion from the main or correction paths. Instead, test points (TP) 262 are used to monitor various points in the nested feed forward system 140 to initially set the gain and phase circuits. Once established, the gain and phase adjustments provided by the gain and phase circuits are fixed. The system 140 can be fixed because even with changing operating conditions, the stable, third correction amplifier still controls the operating characteristics of the system 140. For example, even if changing temperature has caused the correction amplifiers 188 and 218 to produce more distortion d1 and d2, the third correction amplifier 240 will remain linear and still cause the distortion d2 to be reduced, which causes the distortion d1 to still be reduced and thereby the distortion D will still be reduced.

In addition to the embodiments described above, alternative configurations of the nested feed forward distortion reduction system according to the principles of the present invention are possible which omit and/or add components and/or use variations or portions of the described system. For example, FIG. 3 uses coupling paths 170, 204 and 234 to provide improved combination to remove destructive leakage signals at couplers 166, 198 and 230, respectively. Depending on the application, none of these coupling paths, additional coupling paths and/or different coupling path arrangements can be used. Additionally, the system has been described as using couplers, but other devices can be used which are capable of producing two or more signals from a single input, such as 3 dB splitters, directional couplers, hybrid couplers and other coupling, signal splitting or sampling devices. Other combining devices can also be used which produce a single output from two or more inputs, such as summers.

The nested feed forward distortion reduction system is described with fixed gain and phase adjusters, but depending on the embodiment, the gain and/or phase adjusters can be fixed and/or variable, and their location in the feed forward arrangements can change. For example, the locations of the gain and phase circuits 156, 184, or 216 could be respectively switched to path 152, 182 or 214. As such, the the respective delays 164, 196 or 226 may be changed, and/or the delay of the delay 164, 196 or 226 respectively compensated or the location for the delay 164, 196 or 226 respectively switched to the path 150, 180 or 212. The delays can be implemented using passive devices, such as a passive filter, transmission line (coax, microstrip, or stripline), or active devices, such as amplifiers, active filters, digital delays or fiber, but active devices do introduce distortion.

The feed forward system has been further described as using different configurations of discrete components, but it should be understood that the feed forward system and portions thereof can be implemented in application specific integrated circuits, software-driven processing circuitry, firmware or other arrangements of discrete components as would be understood by one of ordinary skill in the art with the benefit of this disclosure. Additionally, for discussion purposes, the nested feed forward distortion reduction system has been described with reference to the signal S, amplified signal S, distortions D, d1 and d2, respective amplified distortions D, d1 and d2, and reduced distortions D', d1' and d2'. It should be understood that different notations, references and characterizations of the various signals can be used. The designations above were chosen to simplify the explanation. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of reducing distortion in an amplified signal, said method comprising the steps of:

splitting a signal onto a main signal path and a feed forward path;

amplifying said signal from said main signal path to produce said amplified signal with distortion on said main signal path;

obtaining a portion of said amplified signal with said distortion;

combining said portion of said amplified signal with said distortion with said signal from said feed forward path to provide said distortion on said feed forward path;

splitting said distortion on said feed forward path onto a correction path and a nested feed forward path;

amplifying said distortion on said correction path to produce amplified distortion with second distortion on said correction path;

obtaining a portion of said amplified distortion with said second distortion;

combining said portion of said amplified distortion with said second distortion with said distortion from said nested feed forward path to provide said second distortion on said nested feed forward path;

splitting said second distortion onto a second correction path and a second nested feed forward path;

amplifying said second distortion on said second correction path to produce said amplified second distortion with third distortion on said second correction path;

obtaining a portion of said amplified second distortion with said third distortion;

combining said portion of said amplified second distortion with said third distortion with said second distortion on said second nested feed forward path to provide said third distortion on said second nested feed forward path;

feeding forward said third distortion to combine with said third distortion on said second correction path and reduce said third distortion on said second correction path;

combining said amplified second distortion on said second correction path with said amplified second distortion on said correction path to reduce said second distortion on said correction path; and combining said distortion with reduced second distortion from said correction path with said distortion on said main signal path.

2. The method of claim 1 further including the step of:

adjusting the relative phase and amplitude between said portion of said distortion with said second distortion and said distortion on said nested feed forward path with fixed phase and amplitude adjustments.

3. The method of claim 2 further including the step of:

adjusting the relative phase and amplitude between said portion of said amplified signal with said distortion and said signal on said feed forward path with fixed phase and amplitude adjustments.

4. The method of claim 1 further including the step of:

adjusting the relative phase and amplitude between said portion of said amplified second distortion with said third distortion and said second distortion signal on said second nested feed forward path with fixed phase and amplitude adjustments.

5. The method of claim 1 wherein said step of feeding forward further including the step of:

amplifying said third distortion on said second nested feed forward path.

6. A distortion reduction system comprising:

a first spitting device configured to receive a signal and provide said signal to a main signal path and a feed forward path;

a main amplifier on said main signal path for amplifying said signal from said main signal path to produce said amplified signal with distortion on said main signal path;

a coupling device on said main signal path provides a portion of said amplified signal with said distortion onto a first coupling path;

a combining device on said feed forward path configured to combine said portion of said amplified signal with said distortion with said signal from said feed forward path to provide said distortion on said feed forward path;

a second spitting device configured to receive said distortion on said feed forward path and provide said distortion to a correction path and a nested feed forward path;

a correction amplifier on said correction path for amplifying said distortion on said correction path to produce amplified distortion with second distortion on said correction path;

a coupling device on said correction path provides a portion of said amplified distortion with said second distortion onto a nested coupling path;

a second combining device on said nested feed forward path configured to combine said portion of said amplified distortion with said second distortion with said distortion from said nested feed forward path to provide said second distortion on said nested feed forward path;

a nested feed forward loop including:

a third spitting device configured to receive said second distortion on said nested feed forward path and provide said second distortion to a second correction path and a second nested feed forward path;

a second correction amplifier on said second correction path for amplifying said second distortion on said second correction path to produce amplified second distortion with third distortion on said correction path;

a coupling device on said second correction path provides a portion of said amplified second distortion with said third distortion onto a second nested coupling path, a combining device on said second nested feed forward path configured to combine said portion of said amplified second distortion with said third distortion from said second nested coupling path with said second distortion from said second nested feed forward path to provide said third distortion on said second nested feed forward path;

a third correction amplifier on said second nested feed forward path amplifies said third distortion;

a fourth combining device on said second correction path combines said amplified second distortion with said third distortion on said second correction path with said third distortion on said second nested feed forward path to reduce said third distortion from said second correction path; and a fifth combining device on said correction path combines said amplified distortion with second distortion on said correction path with said second distortion from said combining device on said second correction path to reduce said second distortion on said correction path; and a third combining device on said main signal path configured to combine said amplified distortion from said from said correction path with said distortion on said main signal path to provide said reduced distortion on said main signal path.

7. The system of claim 6 further including:

a gain and phase adjuster configured to provide fixed relative phase and gain adjustments between said amplified signal with distortion on said main signal path and said signal on said feed forward path.

8. The system of claim 7 further including:

a second gain and phase adjuster configured to provide fixed relative phase and gain adjustments between said amplified distortion with second distortion on said correction path and said distortion on said nested feed forward path.

9. The system of claim 8 further including:

third phase and gain adjustment circuitry configured to provide fixed relative gain and phase adjustments between said amplified second distortion with third distortion on said second correction path and said second distortion on said second nested feed forward path.

* * * * *